US009955570B2

(12) United States Patent
Blum et al.

(10) Patent No.: US 9,955,570 B2
(45) Date of Patent: Apr. 24, 2018

(54) FEATURES OF A FLEXIBLE CONNECTOR IN A PORTABLE COMPUTING DEVICE

(71) Applicant: Apple Inc., Cupertino, CA (US)

(72) Inventors: Matthew W. Blum, San Francisco, CA (US); Christine A. Laliberte, San Francisco, CA (US); Corey N. Axelowitz, San Francisco, CA (US); James Y. Yap, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 68 days.

(21) Appl. No.: 14/975,581

(22) Filed: Dec. 18, 2015

(65) Prior Publication Data

US 2016/0205766 A1 Jul. 14, 2016

Related U.S. Application Data

(63) Continuation of application No. PCT/US2015/066637, filed on Dec. 18, 2015.
(Continued)

(51) Int. Cl.
*H05K 1/00* (2006.01)
*H05K 1/02* (2006.01)
(Continued)

(52) U.S. Cl.
CPC ........... *H05K 1/028* (2013.01); *H05K 1/0216* (2013.01); *H05K 1/0218* (2013.01); *H05K 1/181* (2013.01);
(Continued)

(58) Field of Classification Search
CPC ..... H05K 2201/05; H05K 2201/10681; H05K 1/028; H05K 1/147; H05K 2201/056;
(Continued)

(56) References Cited

U.S. PATENT DOCUMENTS 3,898,393 A 8/1975 Digre
4,814,566 A 3/1989 Sigl
(Continued)

FOREIGN PATENT DOCUMENTS

CN 104407670 A 3/2015
WO 2005043881 A2 5/2005

OTHER PUBLICATIONS

International Patent Application No. PCT/US2015/066637—International Search Report and Written Opinion dated May 30, 2016, 26 pages.
(Continued)

*Primary Examiner* — Binh Tran
(74) *Attorney, Agent, or Firm* — Downey Brand LLP

(57) ABSTRACT

The subject matter of this disclosure relates to a flexible circuit for carrying a signal between electrical components that includes boosting circuitry for mitigating the effects of signal degradation. More particularly the flexible circuit can carry a signal between a main logic board and an input/output board supporting input/output ports of a portable electronic device. The flexible circuit can be configured with bends in order to meet packaging constraints such as avoiding contact with components obstructing a direct path between connectors of the electrical components. Additional bends can also be included in the flexible that facilitate the assembly of the portable electronic device.

18 Claims, 9 Drawing Sheets

Related U.S. Application Data

(60) Provisional application No. 62/101,854, filed on Jan. 9, 2015.

(51) Int. Cl.
| | | |
|---|---|---|
| *H05K 1/18* | (2006.01) | |
| *H05K 5/02* | (2006.01) | |
| *H05K 5/00* | (2006.01) | |
| *H05K 1/11* | (2006.01) | |
| *H05K 9/00* | (2006.01) | |
| *H05K 1/14* | (2006.01) | |

(52) U.S. Cl.
CPC ........... *H05K 1/189* (2013.01); *H05K 5/0247* (2013.01); *H05K 1/118* (2013.01); *H05K 1/14* (2013.01); *H05K 1/147* (2013.01); *H05K 2201/05* (2013.01); *H05K 2201/056* (2013.01); *H05K 2201/0715* (2013.01)

(58) Field of Classification Search
CPC ........ H05K 1/118; H05K 1/0218; H05K 1/14; H05K 1/0224; H05K 1/0225; H05K 2201/10371; H05K 9/0024; H05K 9/0052; H05K 9/0081; H05K 2201/0707; H05K 9/0022; H01L 23/12; H01R 23/6893
USPC ....... 361/749, 752, 753, 760, 764, 780, 783, 361/784, 785, 789, 796, 800, 816, 818
See application file for complete search history.

(56) References Cited

U.S. PATENT DOCUMENTS

| | | | |
|---|---|---|---|
| 5,422,784 | A | 6/1995 | Wakahara et al. |
| 5,424,586 | A * | 6/1995 | Hattori ................ B60R 16/0315 307/10.1 |
| 5,719,799 | A | 2/1998 | Isashi |
| 5,943,214 | A * | 8/1999 | Sato .......................... G08B 6/00 248/638 |
| 6,087,989 | A | 7/2000 | Song et al. |
| 6,168,330 | B1 | 1/2001 | Okada et al. |
| 6,392,871 | B1 | 5/2002 | Yanase |
| 6,429,846 | B2 | 8/2002 | Rosenberg et al. |
| 6,447,314 | B1 | 9/2002 | Kato et al. |
| 6,529,370 | B1 | 3/2003 | Kamishima |
| 6,612,668 | B2 | 9/2003 | Doan |
| 6,654,234 | B2 | 11/2003 | Landry et al. |
| 6,697,495 | B1 | 2/2004 | Youn |
| 6,707,666 | B1 | 3/2004 | Chuang |
| 6,788,530 | B2 | 9/2004 | Hill et al. |
| 6,822,635 | B2 | 11/2004 | Shahoian et al. |
| 6,879,293 | B2 | 4/2005 | Sato |
| 6,911,601 | B1 | 6/2005 | Gilbert et al. |
| 6,975,507 | B2 | 12/2005 | Wang et al. |
| 7,407,202 | B2 | 8/2008 | Ye et al. |
| 7,474,117 | B1 | 1/2009 | Bandholz et al. |
| 7,480,132 | B2 | 1/2009 | Wu et al. |
| 7,489,502 | B2 | 2/2009 | Hong et al. |
| 7,495,898 | B2 | 2/2009 | Lo et al. |
| 7,907,399 | B2 | 3/2011 | Kim et al. |
| 7,920,378 | B2 | 4/2011 | Mihara et al. |
| 7,933,123 | B2 | 4/2011 | Wang et al. |
| 7,969,731 | B2 | 6/2011 | Yang et al. |
| 7,984,936 | B2 | 7/2011 | Lee |
| 8,068,059 | B2 | 11/2011 | Konishi |
| 8,081,433 | B2 | 12/2011 | Iwata |
| 8,164,898 | B2 | 4/2012 | Chen et al. |
| 8,208,249 | B2 | 6/2012 | Chin et al. |
| 8,300,389 | B2 | 10/2012 | Kang et al. |
| 8,340,735 | B2 | 12/2012 | Edeler |
| 8,564,941 | B2 | 10/2013 | Watabe et al. |
| 8,604,931 | B1 | 12/2013 | Veloso et al. |
| 8,654,524 | B2 | 2/2014 | Pance et al. |
| 8,660,623 | B2 | 2/2014 | Man et al. |
| 8,687,353 | B2 | 4/2014 | Murakata |
| 8,773,846 | B2 | 7/2014 | Wang |
| 8,792,231 | B2 | 7/2014 | Derryberry |
| 9,048,665 | B2 | 6/2015 | Wojcik et al. |
| 9,203,137 | B1 | 12/2015 | Guterman et al. |
| 9,276,626 | B2 | 3/2016 | Rayner |
| 9,277,035 | B2 | 3/2016 | Sung et al. |
| 9,411,380 | B2 | 8/2016 | Farahani et al. |
| 9,575,514 | B2 | 2/2017 | Robinson et al. |
| 9,710,023 | B2 | 7/2017 | Shi et al. |
| 2002/0032510 | A1 | 3/2002 | Turnbull et al. |
| 2002/0044132 | A1 | 4/2002 | Fish |
| 2002/0044446 | A1 | 4/2002 | Layne et al. |
| 2002/0046879 | A1 | 4/2002 | Barabash |
| 2002/0191808 | A1 | 12/2002 | Croft, III et al. |
| 2004/0051670 | A1 | 3/2004 | Sato |
| 2004/0057197 | A1 | 3/2004 | Hill et al. |
| 2004/0150486 | A1 | 8/2004 | Barr et al. |
| 2004/0201532 | A1 | 10/2004 | Apostolos et al. |
| 2005/0078463 | A1* | 4/2005 | Chheda ................ G06F 1/189 361/789 |
| 2005/0105256 | A1 | 5/2005 | Chuang |
| 2005/0129263 | A1 | 6/2005 | Tamura et al. |
| 2005/0180100 | A1 | 8/2005 | Thomason |
| 2006/0034467 | A1 | 2/2006 | Sleboda et al. |
| 2006/0054704 | A1 | 3/2006 | Fitch et al. |
| 2006/0104469 | A1 | 5/2006 | Hawker et al. |
| 2006/0164799 | A1 | 7/2006 | Varela |
| 2006/0293091 | A1 | 12/2006 | Hawker et al. |
| 2007/0004241 | A1 | 1/2007 | Meier et al. |
| 2007/0075613 | A1 | 4/2007 | Mau |
| 2007/0116261 | A1 | 5/2007 | Hawker et al. |
| 2008/0053713 | A1* | 3/2008 | Huang .................. G06F 1/1626 178/18.03 |
| 2008/0164055 | A1* | 7/2008 | Wang ...................... G06F 1/189 174/260 |
| 2008/0271288 | A1 | 11/2008 | Senatori |
| 2009/0027849 | A1 | 1/2009 | Tanaka |
| 2009/0032289 | A1 | 2/2009 | Timms et al. |
| 2009/0079723 | A1 | 3/2009 | Wang et al. |
| 2009/0257207 | A1 | 10/2009 | Wang et al. |
| 2009/0323268 | A1 | 12/2009 | Iwata |
| 2010/0061584 | A1 | 3/2010 | Lin et al. |
| 2010/0073241 | A1 | 3/2010 | Vazquez et al. |
| 2010/0091442 | A1 | 4/2010 | Theobald et al. |
| 2010/0138763 | A1 | 6/2010 | Kim |
| 2010/0276193 | A1 | 11/2010 | Liu |
| 2010/0296243 | A1 | 11/2010 | Lu |
| 2010/0321253 | A1 | 12/2010 | Vazquez et al. |
| 2010/0326720 | A1 | 12/2010 | Tsao et al. |
| 2010/0328182 | A1 | 12/2010 | Wong et al. |
| 2011/0045881 | A1 | 2/2011 | Lo et al. |
| 2011/0051345 | A1 | 3/2011 | Watabe et al. |
| 2011/0094790 | A1* | 4/2011 | Lin ........................ H05K 1/028 174/350 |
| 2011/0120901 | A1 | 5/2011 | Liu et al. |
| 2011/0141052 | A1 | 6/2011 | Bernstein et al. |
| 2011/0193459 | A1 | 8/2011 | Yang et al. |
| 2012/0018208 | A1 | 1/2012 | Shimasaki |
| 2012/0078627 | A1 | 3/2012 | Wagner |
| 2012/0187809 | A1 | 7/2012 | Kim |
| 2012/0194393 | A1 | 8/2012 | Uttermann et al. |
| 2012/0212903 | A1 | 8/2012 | Hopkinson et al. |
| 2012/0223866 | A1 | 9/2012 | Vazquez et al. |
| 2012/0285737 | A1 | 11/2012 | Judy et al. |
| 2012/0314378 | A1 | 12/2012 | Liao |
| 2012/0326886 | A1 | 12/2012 | Herman et al. |
| 2013/0003280 | A1 | 1/2013 | Degner et al. |
| 2013/0044419 | A1 | 2/2013 | Watanabe |
| 2013/0063004 | A1 | 3/2013 | Lai et al. |
| 2013/0070951 | A1 | 3/2013 | Tanaka et al. |
| 2013/0077217 | A1 | 3/2013 | Trzaskos et al. |
| 2013/0148315 | A1 | 6/2013 | Dabov |
| 2013/0207853 | A1 | 8/2013 | Yamamoto et al. |
| 2013/0241641 | A1 | 9/2013 | Zhu et al. |
| 2013/0265708 | A1 | 10/2013 | Mathew et al. |
| 2013/0307736 | A1 | 11/2013 | Larsen et al. |
| 2013/0329359 | A1 | 12/2013 | Andre et al. |

(56) References Cited

U.S. PATENT DOCUMENTS

| | | |
|---|---|---|
| 2014/0009344 A1 | 1/2014 | Zhu et al. |
| 2014/0043744 A1 | 2/2014 | Matsuoka et al. |
| 2014/0092552 A1 | 4/2014 | Bekele |
| 2014/0203974 A1 | 7/2014 | Liu et al. |
| 2014/0268517 A1 | 9/2014 | Moon et al. |
| 2014/0268593 A1* | 9/2014 | Derosa .................. H05K 1/028 361/749 |
| 2014/0286522 A1 | 9/2014 | Forbes et al. |
| 2014/0292588 A1 | 10/2014 | Yoon et al. |
| 2014/0347228 A1 | 11/2014 | Tseng et al. |
| 2015/0237733 A1 | 8/2015 | Stahr et al. |
| 2015/0338883 A1 | 11/2015 | Farahani et al. |
| 2015/0338887 A1 | 11/2015 | Farahani et al. |
| 2016/0033621 A1 | 2/2016 | Ottenhues et al. |
| 2016/0105749 A1 | 4/2016 | Qutub et al. |
| 2016/0202727 A1 | 7/2016 | Lin et al. |
| 2016/0202735 A1 | 7/2016 | Robinson et al. |
| 2016/0209870 A1 | 7/2016 | Farahani et al. |
| 2016/0212892 A1 | 7/2016 | Sweet et al. |
| 2016/0216735 A1 | 7/2016 | Reid et al. |
| 2016/0216741 A1 | 7/2016 | Farahani et al. |
| 2016/0219353 A1 | 7/2016 | Whitwell |
| 2016/0259375 A1 | 9/2016 | Andre et al. |
| 2016/0327980 A1 | 11/2016 | Farahani et al. |
| 2016/0327986 A1 | 11/2016 | Farahani et al. |
| 2017/0003718 A1 | 1/2017 | Farahani et al. |
| 2017/0133743 A1 | 5/2017 | Kato et al. |

OTHER PUBLICATIONS

International Search Report and Written Opinion; Application No. PCT/US2015/053026; dated Aug. 4, 2016, 39 pages.

\* cited by examiner

FEATURES OF A FLEXIBLE CONNECTOR IN A PORTABLE COMPUTING DEVICE

CROSS-REFERENCE TO RELATED APPLICATIONS

This application is a continuation of International Application PCT/US2015/066637, with an international filing date of Dec. 18, 2015, entitled "FEATURES OF A FLEXIBLE CONNECTOR IN A PORTABLE COMPUTING DEVICE," and claims the benefit of priority under 35 U.S.C § 119(e) to U.S. Provisional Application No. 62/101,854, filed Jan. 9, 2015, entitled "FEATURES OF A FLEXIBLE CONNECTOR IN A PORTABLE COMPUTING DEVICE," each of which is incorporated herein by reference in its entirety.

FIELD

The described embodiments relate generally to internal connectors for an electronic device. In particular, the present embodiments relate to internal connectors taking the form of flexible circuits having shielded surface mounted electrical components.

BACKGROUND

Many portable computing devices utilize internal connectors that carry signals to route communications between internal components of the portable computing devices. As portable computing devices continue to take advantage of new input/output (I/O) protocols that allow for increasingly rapid I/O communications, high-speed signals traveling between I/O interfaces and other internal components become more susceptible to signal degradation when compared to lower speed I/O interfaces. For example, USB 2.0 signals can be less susceptible to signal degradation than signals utilizing USB 3.0 protocols. One situation where signal degradation becomes an issue occurs when a first component requires connection to a second component offset a substantial distance from the first component. The signal degradation can be mitigated by boosting components that can be integrated within the first component or the second component in order to ameliorate the signal degradation. Unfortunately, packaging or other engineering constraints can prevent the integration of boosting components within the first or the second component.

SUMMARY

This paper describes various embodiments that relate to flexible connectors that route communications between internal electrical components.

A flexible connector assembly is disclosed. The flexible connector assembly can include a flexible substrate that includes a power layer and a data layer. The data layer and the power layer are separated at a bend region of the flexible substrate. The bend region has a geometry that includes at least two separate bends oriented in different directions, which cooperate to accommodate relative motion of components connected by the flexible connector in at least two dimensions. The flexible connector assembly can further include a first connector disposed on a first end of the flexible substrate and a second connector disposed on a second end of the flexible substrate. Further, circuitry for processing signals passing through the data layer is mounted to the flexible substrate and electrically coupled with both the power layer and the data layer.

An electronic device is disclosed. The electronic device includes at least the following: a device housing; a port arranged along an exterior surface of the device housing that receives data and system power for the electronic device; and an electrical connector that routes data and power received at the data port to electrical components within the device housing, the electrical connector including a flexible substrate, and circuitry surface mounted to the flexible substrate that boosts the strength of data signals travelling through the flexible connector.

A flexible connector is disclosed. The flexible connector includes a flexible substrate including a data layer and a power layer; an electrical assembly surface mounted to an exterior surface of the flexible substrate and in electrical contact with the data layer and the power layer; and electrical connectors positioned at opposite ends of the flexible substrate. The electrical assembly processes a signal routed through the data layer while data is being passed through the data layer.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
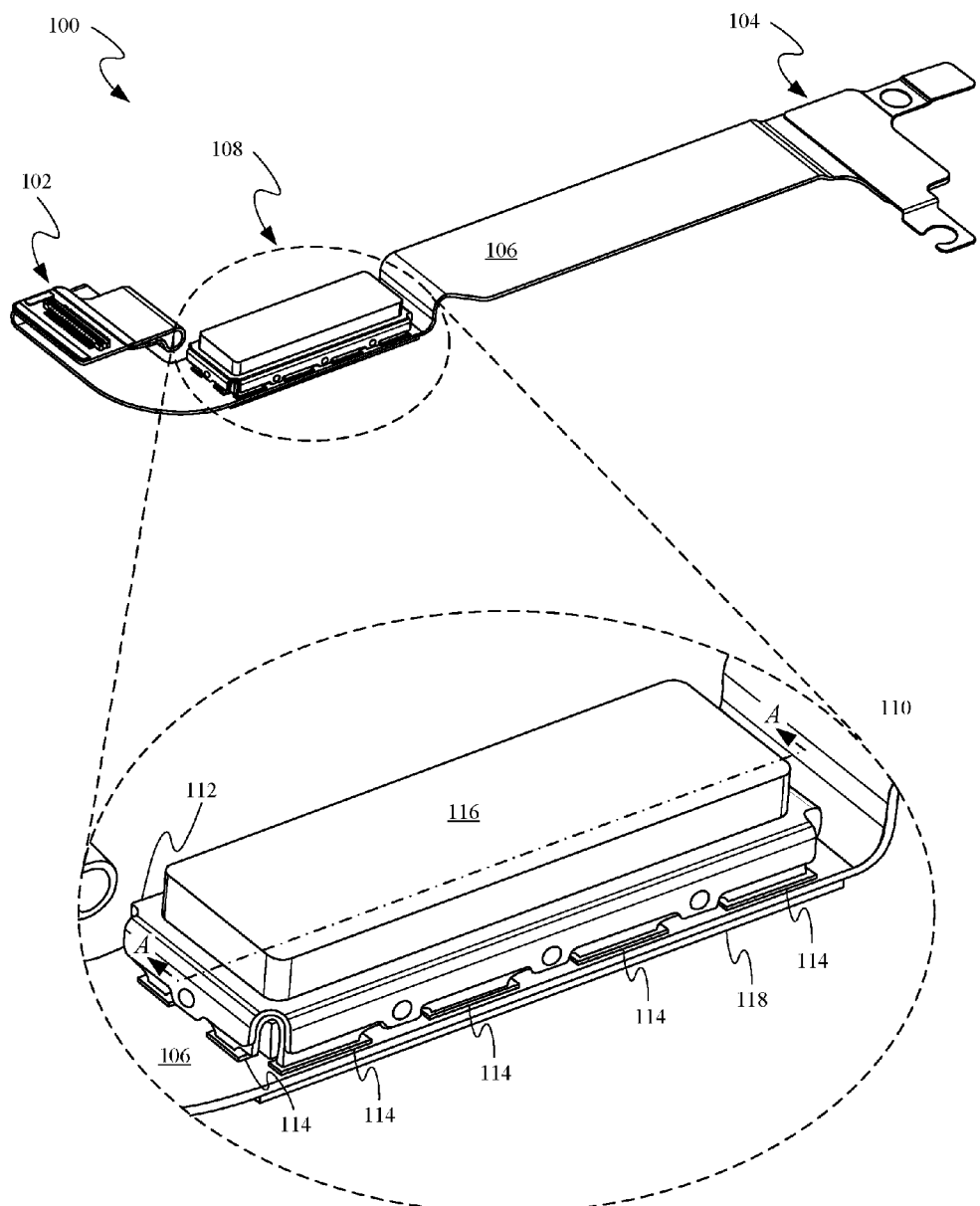
FIG. 1A shows a perspective view of a flexible circuit in accordance with the described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

A flexible circuit ("flex") is an electronic circuit printed on a flexible polymer substrate that can be utilized to construct a flexible connector in applications where flexibility, space savings, or other production constraints prevent traditional connectors, such as wires from being utilized. In some embodiments, a flex can be utilized to construct a flexible circuit assembly that connects a first component to a second component. For example, the flexible circuit assembly can interconnect a first electrical component to a second electrical component. The components can then communicate with each other over signals transmitted by the flex. The signals can be transmitted by a number of electrically conductive pathways that can take the form of leads and traces embedded within the flex. The electrically conductive pathways can handle discrete routing of a number of signals between the first and second electrical components. It should be noted that the electrically conductive pathways can be distributed across a number of different layers that make up the flex.

One limitation of a flexible circuit construction is that signals can degrade if the electrical pathways within the flex extend across too great a distance. For this reason, designers generally minimize a length of the flex to avoid signal degradation. Unfortunately, this limits a distance across which the flex can be used to form an electrical connection. One solution to this problem is to boost the signal carried by the flex back up to a usable level. The signal can be boosted by signal boosting components surface mounted to the flex. In this way, the flex can extend across substantially greater distances. The signal boosters can be powered in any number of ways, including: embedding a discrete power specific layer within the flex; incorporating traces in the flex that carry power in addition to signals; and adding a power connector proximate the signal boosting components. In some embodiments, the power specific layer can take the form of a conductive substrate along the lines of a thin layer of conductive metal. In such an embodiment, the flex can also include one or more signal layers that each include a number of traces. The flexible circuit can also include a discrete grounding layer utilized to provide a convenient pathway to ground for components or circuits traveling through the flex. In some embodiments, the discrete grounding layer can isolate signal layers of the flexible circuit.

In some embodiments, some portions of the flex may need to undergo substantially more bending than other portions of the flex. Flexibility of these portions of the flex can be increased by separating the power layer from one or more of the signal layers, when no interconnections between the separated power and signal layers are required in these portions. For example, in select regions of the flex a portion of a bonding layer that ordinarily joins the signal layer to the power layer can be removed so that the signal layer and the power layer can bend or flex independently. This decoupling of the layers reduces stress induced by bending of the flex. In some embodiments, the bending of the flex can make installation of the flex during an assembly operation substantially easier. In some specific embodiments, the bends can be configured to facilitate assembly of a top case to a bottom case of an electronic device, when the flex connects components distributed in both the top case and the bottom case. The flex can include a number of bends that facilitate the connection of a main logic board (MLB) to an input output (I/O) board. For example, the MLB can be located on a first housing component such as a top case and the I/O board can be located on a second housing component such as a bottom case.

In some embodiments, a connector at one end of the flex can be secured to an electrical component by adding a stiffener along a surface of the flex opposite the connector. The stiffener can include arms extending laterally away from the connector that allow the stiffener to be securely fastened to attachment points on the electrical component. In embodiments, where the stiffener overlays a substantial portion of the connector, the stiffener can also normalize an amount of force exerted against the connector, thereby improving a reliability and fit of the connector with a connector receiver on the electrical component. The stiffeners can be attached near the connectors in any number of ways including by adhesive and by a soldering operation. In some embodiments, the stiffener can have three-dimensional geometry that allows portions of the stiffener to lie flat against corresponding attachment points of the electrical component to which it is secured.

These and other embodiments are discussed below with reference to FIGS. 1-5. However, those skilled in the art will readily appreciate that the detailed description given herein with respect to these Figures is for explanatory purposes only and should not be construed as limiting.

FIG. 1A depicts flexible circuit assembly 100 in accordance with the various embodiments. Flexible circuit assembly 100 can include first connector assembly 102 at a first end of flexible circuit assembly 100 and a second connector assembly 104 at a second end of flexible circuit assembly 100. Each of the connector assemblies can include a board-to-board connector for electrically coupling a first electrical component to a second electrical component. The first component can transmit a number of discrete transmissions to the second component across flexible circuit assembly 100 by way of a number of signal pathways or traces embedded within flexible substrate 106. In one particular embodiment, the first component can be an input/output ("I/O") board and the second component can be a main logic board ("MLB") of a portable electronic device. It should be understood that the I/O board and MLB configuration described is used for exemplary purposes only and it should be understood that flexible circuit assembly 100 can be utilized to electrically couple any number of disparate electrical components. In some embodiments, flexible circuit assembly 100 can transmit data associated with many different types of user-accessible I/O ports, including for example Universal Serial Bus (USB) ports, High-definition Multimedia Interface (HDMI) ports, Digital Visual Interface (DVI) ports, Ethernet ports, DisplayPort ports, Thunderbolt ports, power ports and analog audio ports. Flexible substrate 106 can include numerous data and/or power specific layers across which data associated with the different ports can be distributed. In some embodiments, flexible substrate 106 can be bent and flexed so that flexible circuit assembly 100 avoids other circuitry within the portable electronic device.

In some embodiments, the signal pathways embedded within flexible substrate 106 can have a length that causes the signal they carry to degrade across flexible circuit assembly 100 to an extent that the signals are too weak to be effectively utilized. In order to compensate for the signal degradation, flexible circuit assembly 100 can include booster assembly 108, depicted in close up view 110. Booster assembly 108 is positioned near first connector assembly 102 so that signals running through flexible substrate 106 can be boosted just prior to arriving at the component to which first connector assembly is connected. In this way, any additional signal degradation can be minimized due to the short span between first connector assembly 102 and booster assembly 108. In some embodiments, booster assembly 108 can represent a number of surface mounted components (not depicted) for boosting the signal between the I/O board and the MLB. One of the surface mounted components can include a USB re-driver. Booster assembly 108 can also include shield 112 for covering and shielding one or more of the surface mounted components. Shield 112 can be an electromagnetic interference (EMI) shield made up of a number of radio frequency (RF) opaque layers. In some embodiments, at least one of the layers that form shield 112 can be surface mounted to flexible substrate 106 by way of grounding pads 114 and take the form of a fence configured to receive a shielding can that covers a top surface of components it is configured to shield. In some embodiments, the layers of shield 112 that are not surface mounted can be snapped to or soldered to the other layers of shield 112. Snap attachment of the shielding can to the fence can make for easier access to components beneath the shielding can. In some embodiments, shield 112 can also be grounded through grounding pads 114 in order to form a faraday cage suitable for shielding the one or more surface mounted components from electromagnetic interference. Shield 112 can also be grounded by gasket 116. In some embodiments, gasket 116 can be formed from a block of conductive foam. The conductive foam forming gasket 116 can form a robust grounding pathway between shield 112 and an interior surface of a housing of an associated portable electronic device when gasket 116 is compressed against the interior surface of the housing. In some embodiments the interior surface can be associated with a keyboard assembly.

Figure 1B:
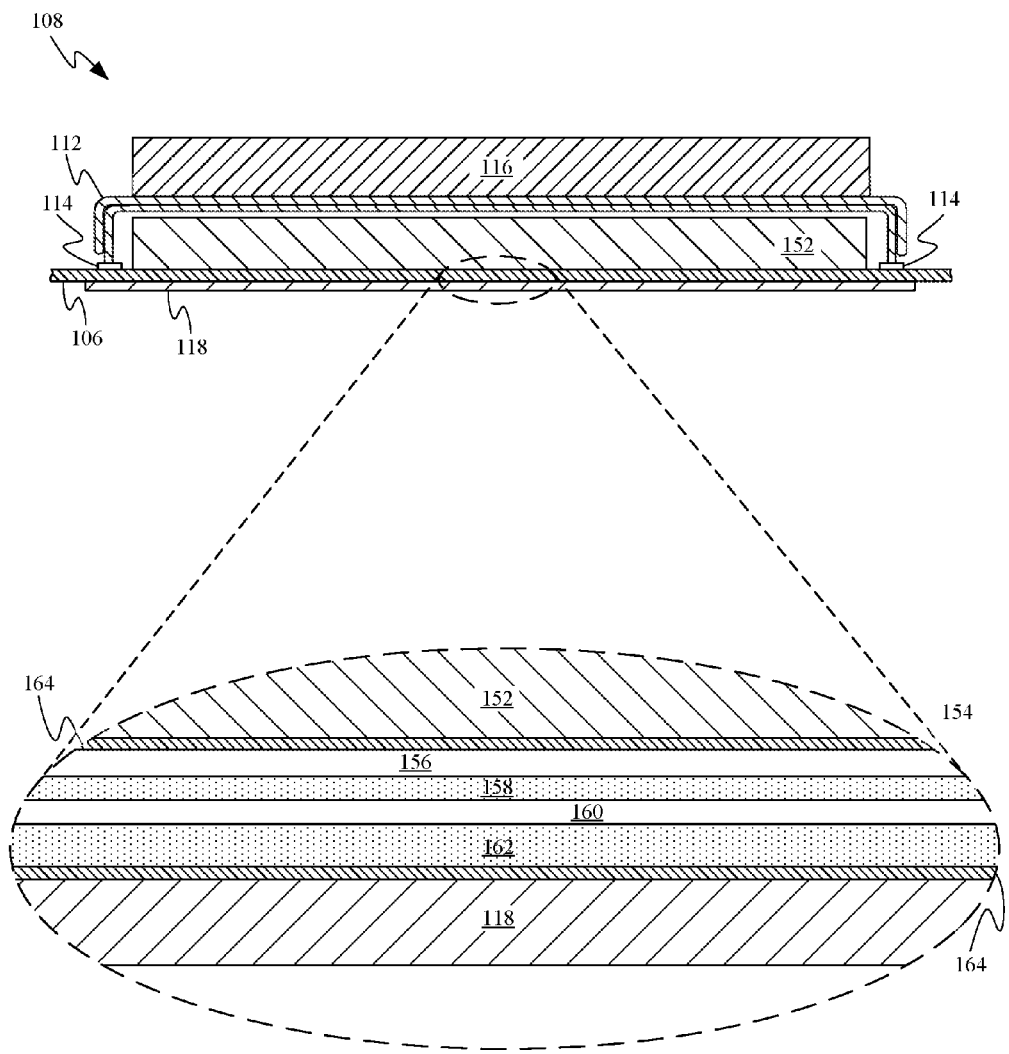
FIG. 1B shows a cross-sectional view of a booster assembly of the flexible circuit depicted in FIG. 1A.

FIG. 1B depicts a cross-sectional view of booster assembly 108 in accordance with section line A-A. Boosting component 152 is surface mounted to flexible substrate 106. Boosting component 152 can include circuitry for boosting multiple signals carried by flexible circuit assembly 100. In some embodiments, boosting component 152 can represent a number of separately adhered sub-assemblies in cases where different signals are boosted by separate sub-assemblies. In some embodiments, one or multiplexing components can be configured to cooperate with boosting component 152 so that a number of different types of signals can be separated and/or combined prior to or subsequent to boosting the power of the inputs. In some embodiments, boosting component 152 can be configured to overcome any signal degradation caused by the multiplexing components. Shield 112 can cover boosting component 152 and protect boosting component 152 from electromagnetic interference. In some embodiments, shield 112 cooperates with conductive material embedded in an exterior layer of flexible substrate 106 (see description of shield layer 164 below) to form a faraday cage that surrounds and protects boosting component 152 by preventing the passage of EMI through shield 112 with the faraday cage. Alternatively, a bottom side of the faraday cage can be formed by a grounding layer within flexible substrate 106 or by stiffener 118 when stiffener 118 is formed of electrically conductive material. In some embodiments, gasket 116 can form a grounding pathway for shield 112. Gasket 116 can be adhesively secured to an internal surface of a device housing to help secure flexible circuit assembly 100 in place within the device housing. Gasket 116 can take the form of a conductive foam that increases in conductivity when compressed. The conductive foam can be a foam infused with metals along the lines of aluminum, copper, steel, or nickel. In some embodiments, shield 112 can also be grounded through grounding pads 114.

FIG. 1B includes close up view 154, which shows a magnified detail of flexible substrate 106, which is made up of a number of discrete layers 156, 158, 160, 162 and 164. In some embodiments, flexible substrate 106 includes a number of signal layers depicted as high-speed layer 156 and low-speed layer 160. Each of the signal layers can include various trace patterns that distribute discrete signals through the respective layer. While high-speed layer 156 can be configured to provide passage for a majority of higher bandwidth signals and low-speed layer 160 can be configured for low bandwidth signals, in certain embodiments high-speed and low-speed signals can be interspersed between the signal layers As depicted, flexible substrate 106 also includes grounding layer 158 and power layer 162; however, different ordering of the various layers may be utilized in order to minimize interference effects such as induced capacitance, which can adversely affect the integrity of signals carried on high-speed layer 156 and low-speed layer 160. In some embodiments, grounding layer 158 can help to insulate high-speed layer 156 from other signals and power traveling through flexible substrate 106. Flexible substrate 106 can also include shield layers 164 that define an exterior surface of flexible substrate 106 and help to protect signals routed through flexible substrate 106 from external interference. Shield layers 164 can be formed of any suitable grounding or electromagnetic interference shielding film such as PC3300 film produced by Tatsuta Electronic Materials. Shield layers 164 can include electrically conductive materials that allow shield layers 164 to form a grounding pathway for components mounted to an exterior surface of flexible substrate 106 without having to include routing that carries the grounding pathway through high-speed layer 156 and into grounding layer 158. In some embodiments, flexible circuit assembly 100 can also include stiffener 118. Stiffener 118 can provide stiffness to a region of flexible substrate 106 beneath shield 112. Stiffener 118 can attach to flexible circuit assembly 100 via an adhesive layer. Alternatively, stiffener 118 can be surface mounted to flexible substrate 106. In some embodiments, stiffener 118 can be formed from sheet metal containing aluminum, copper, steel, or stainless steel. Stiffener 118 can be electrically coupled with shield 112 by way of electrically conductive pathways within flexible substrate 106 and grounding pads 114. Stiffener 118 can also be formed from a non-conductive material. In such a case stiffener 118 can still provide mechanical support for shield 112.

In some embodiments, boosting component 152 can be electrically coupled with traces located in high-speed layer 156. The close proximity of high-speed layer 156 to boosting component 152 depicted in FIG. 1B can simplify signal routing between high-speed layer 156 and boosting component 152. Boosting component 152 can include one or more USB re-drivers that boost signals received from one or more multiplexers. The one or more USB re-drivers and one or more multiplexers can cooperate with other suitable components to boost and combine a number of high-speed signals from high-speed layer 156. For example, the multiplexing circuitry can combines multiple signals along the lines of USB 3.0, USB 2.0, and DisplayPort signals into a single high-speed signal that can be boosted or amplified by the USB re-drivers. In some embodiments, high-speed signals from high-speed layer 156 can be combined with low-speed signals from low-speed layer 160 by the multiplexer. In some embodiments, separating out the USB 2.0 signal from the high-speed signal and multiplexing the USB signal with the low-speed signal may reduce interference. The low-speed signal can be carried on traces located on low-speed layer 160. Grounding layer 158 can interconnect with various components that can benefit from a grounding connection. For example, grounding pad 114 can electrically couple with grounding layer 158 in order to ground shield 112. Grounding layer 158 can also be useful for reducing interference between high-speed layer 156 and low-speed layer 160. In some embodiments, boosting component 152 can electrically contact grounding layer 158. In some embodiments boosting components 152 can require power. Flexible substrate 106 can include electrically conductive pathways that electrically couple boosting component 152 with power layer 162 so that boosting component 152 can draw power from power layer 162. In some embodiments, grounding layer 158 and power layer 162 can take the form of a single conductive material. In some embodiments, power layer 162 can be configured to receive all power used to power an associated electronic device when the associated electronic device is receiving external power.

Figure 2A:
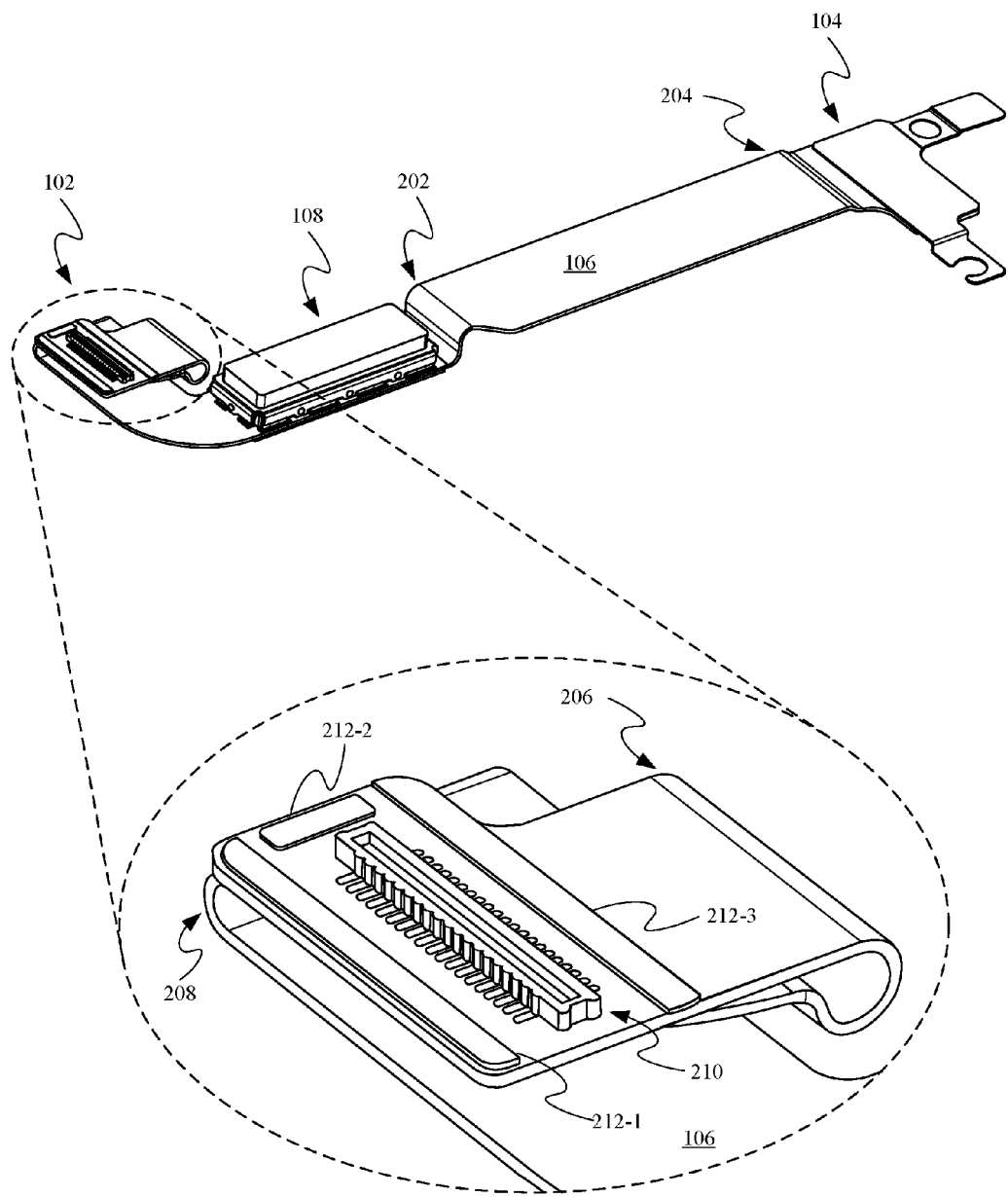
FIG. 2A shows a perspective view of a connector in a folded state at an end of the flexible circuit.

FIG. 2A shows how flexible circuit assembly 100 can also include a number of bend regions 202, 204, 206 and 208. Some bend regions such as bend regions 202 and 204 can be configured to allow flexible circuit assembly 100 to avoid circuitry proximate a path across which flexible circuit assembly 100 extends. Other bend regions such as bend regions 206 and 208 can allow flexible circuit assembly 100 to accommodate motion proximate first connector assembly 102. Because bend regions 206 and 208 undergo substantially more bending than regions 202 and 204, the flexibility of bend regions 206 and 208 can be adjusted to accommodate the greater bending. It should be noted that while bend regions 206 and 208 are the only regions dedicated to this motion accommodation it should be noted that any number of bends can be utilized to accomplish this purpose depending on relative positioning between components and the nature of an assembly operation associated with the associated portable electronic device. In some embodiments, additional bends can be located proximate second connector assembly 104 for further accommodation of movement during an assembly operation. FIG. 2A also includes a close up view clearly depicting connector 210. Connector 210 can be embodied as a board-to-board connector, as depicted. Connector 210 can be surrounded by a number of metallic strips 212 that are electrically coupled to shield layer 164 (not depicted, see FIG. 1B) of flexible substrate 106 provide a floor grounding function for connector 210. By bonding metallic strips 212 directly to shield layer 164 of flexible substrate 106 conductive material within shield layer 164 can provide a grounding path for connector 210. In some embodiments, metallic strip 212-1 can be formed of different material than the material used to form metallic strips 212-2 and 212-3. For example, in some embodiments metallic strips 212-2 and 212-3 can be formed primarily of a copper alloy and metallic strip 212-1 can be formed at least in part of gold. In some embodiments, a windowed gasket formed of conductive foam can surround connector 210 and be compressed between metallic strips 212 and the component to which connector 210 is electrically coupled. The windowed gasket can insulate connector 210 against interference.

Figure 2B:
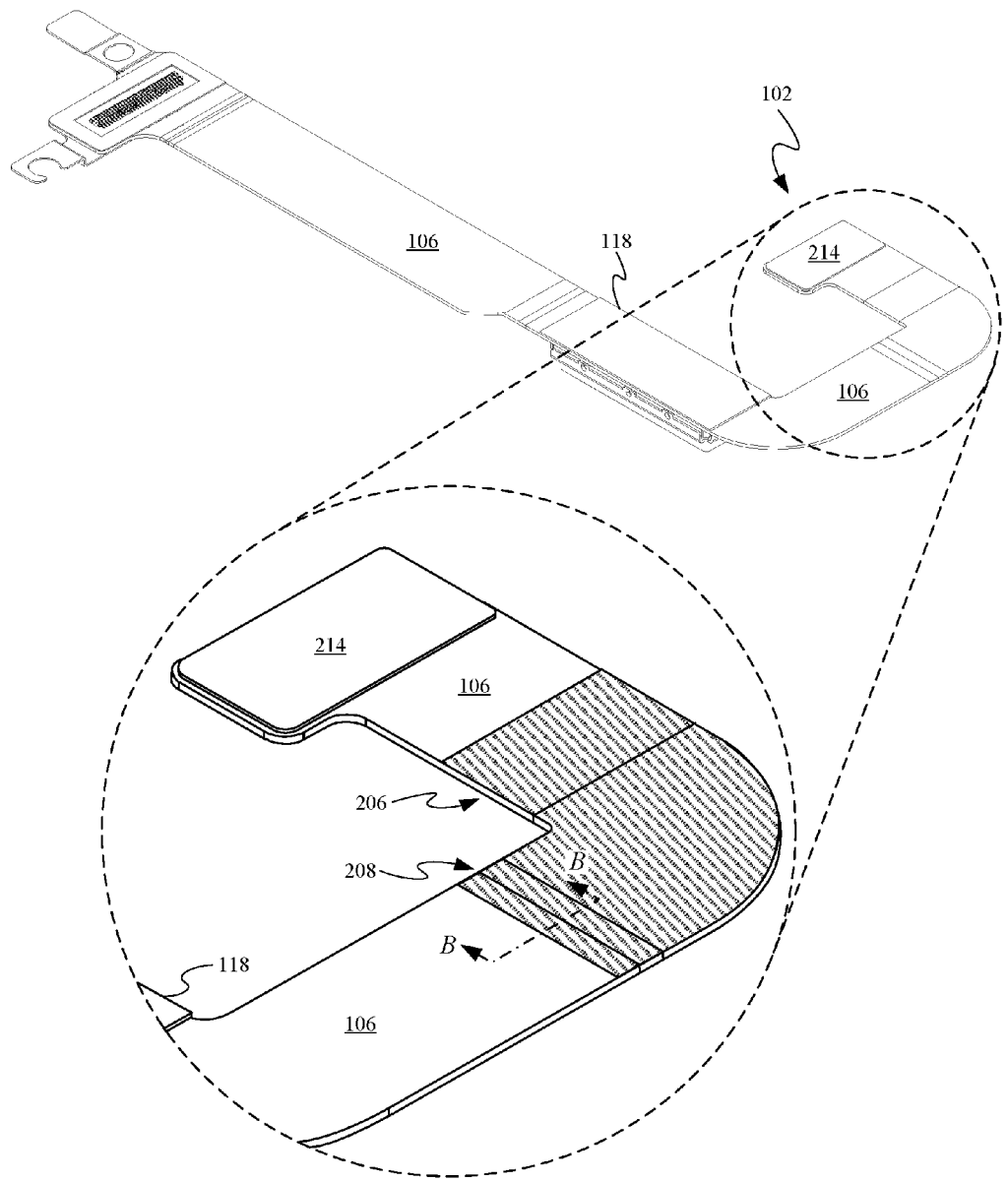
FIG. 2B shows a perspective view of the end of the flexible circuit in an unfolded state.

FIG. 2B depicts a detailed view of first connector assembly 102 of flexible circuit assembly 100. In some embodiments, flexible circuit assembly 100 can include stiffener 214 for providing stiffness on one or both sides of flexible circuit assembly 100. Stiffener 214 is depicted on the opposite side of second connector assembly 104. Stiffener 214 can be surface mounted to flexible circuit assembly 100 or attached via adhesive. First connector assembly 102 can also include first bend region 202 and second bend region 204. In some embodiments, bend regions 202 and 204 can allow flexible circuit assembly 100 to avoid underlying circuitry of the portable electronic device. For example such as components located on the MLB that could interfere with the function of flexible circuit assembly 100 can be avoided. In some embodiments, bend region 206 and bend region 208 may require a greater amount of flexibility than flexible circuit assembly 100 would generally allow. However, the flexibility of flexible circuit assembly 100 may be increased by splitting layers of flexible circuit assembly 100 in a particular region as detailed below. The hashed region shown in the closeup view of FIG. 2B shows an area across which the layers can be split or separated.

Figure 2C:
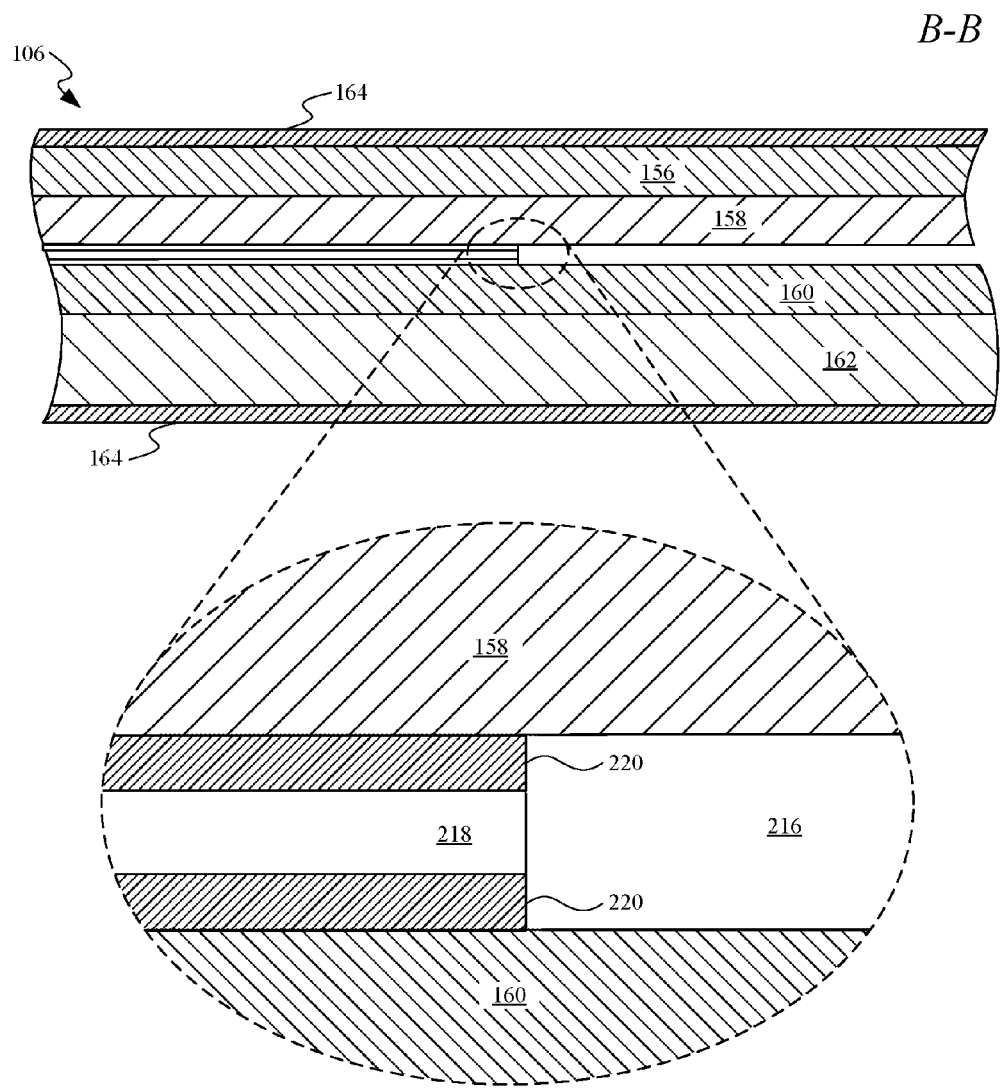
FIG. 2C shows an air gap between layers of the flexible circuit at the end of the flexible circuit.

FIG. 2C depicts a cross-sectional view of flexible substrate 106 at a location in which flexible substrate 106 splits into multiple layers to form an air gap 216 between the layers. FIG. 2C shows how flexible substrate 106 is bonded together by at least one bonding layer formed of bonding sheet 218 adhered with two layers of coverlay 220. By ending the bonding layer as depicted, air gap 216 is created between grounding layer 158 and low-speed layer 160. In some embodiments, the separated layers can have different areas that can also allowing flexible circuit assembly 100 to bend.

Figure 3:
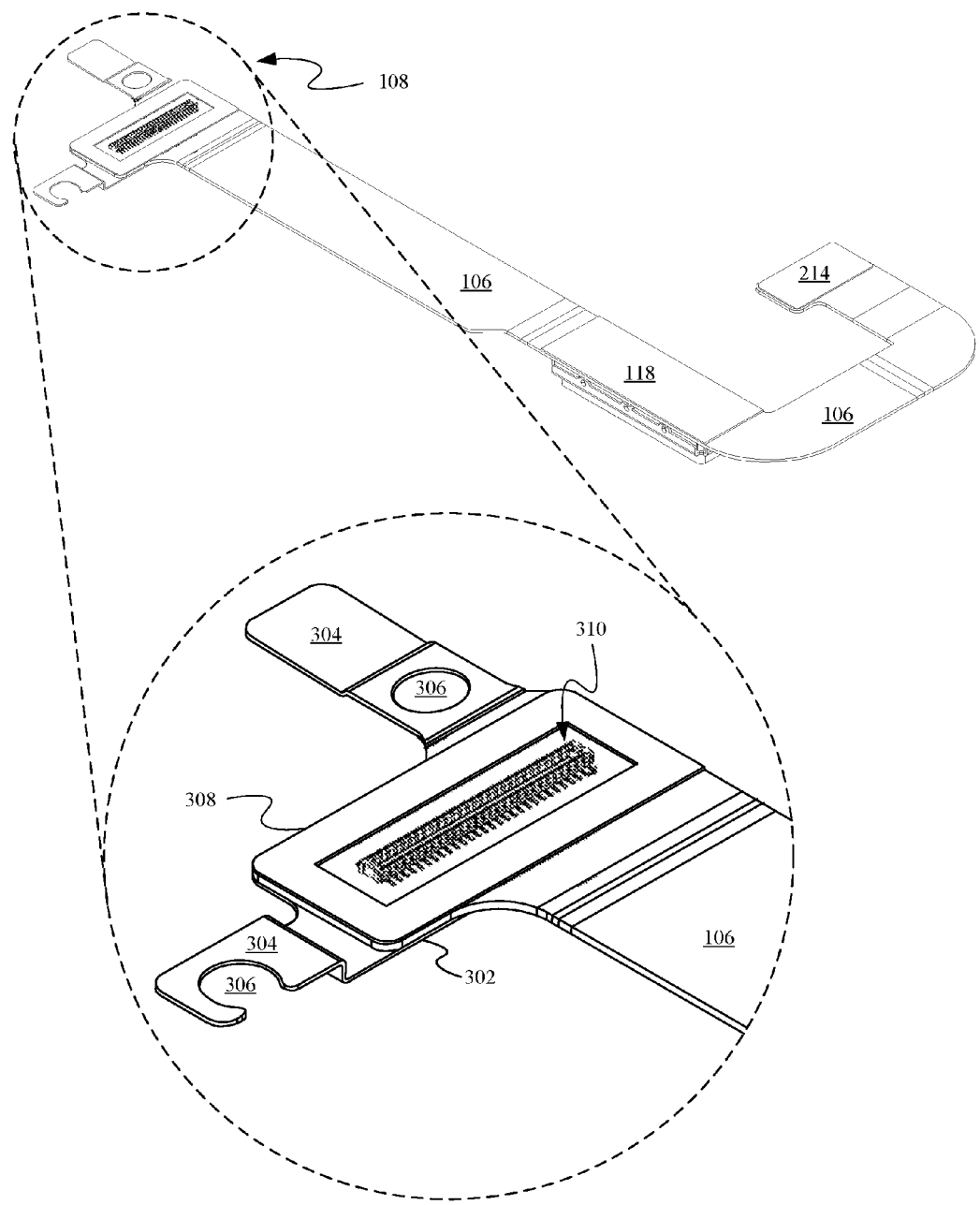
FIG. 3 shows a detailed view of another end of the flexible circuit.

FIG. 3 shows how flexible circuit assembly 100 can also include stiffener 302. Stiffener 302 can provide stiffness on one or both ends of flexible circuit assembly 100. Stiffener 302 is depicted as being disposed at a single end of flexible circuit assembly 100 and includes arms 304. Arms 304 can be coupled with the first or the second component in order to securely attach one end of flexible circuit assembly 100. Arms 304 can define openings 306 for accepting fasteners that engage attachment points on one of the first and second component. Stiffener 302 can be attached to flexible substrate 106 via an adhesive layer or stiffener 302 can be surface mounted to flexible substrate 106. In some embodiments, stiffener 302 can be formed from sheet metal containing aluminum, copper, steel, or stainless steel. In some embodiments, the stiffeners can help to ensure that grounding ring 308 that surrounds connector 310 receives an even amount of pressure for reliably grounding connector 310. Stiffener 302 can also prevent connector 310, which can take the form of a board-to-board connector from dislodging from a slot defined by an electrical component to which flexible circuit assembly 100 is attached.

Figure 4A:
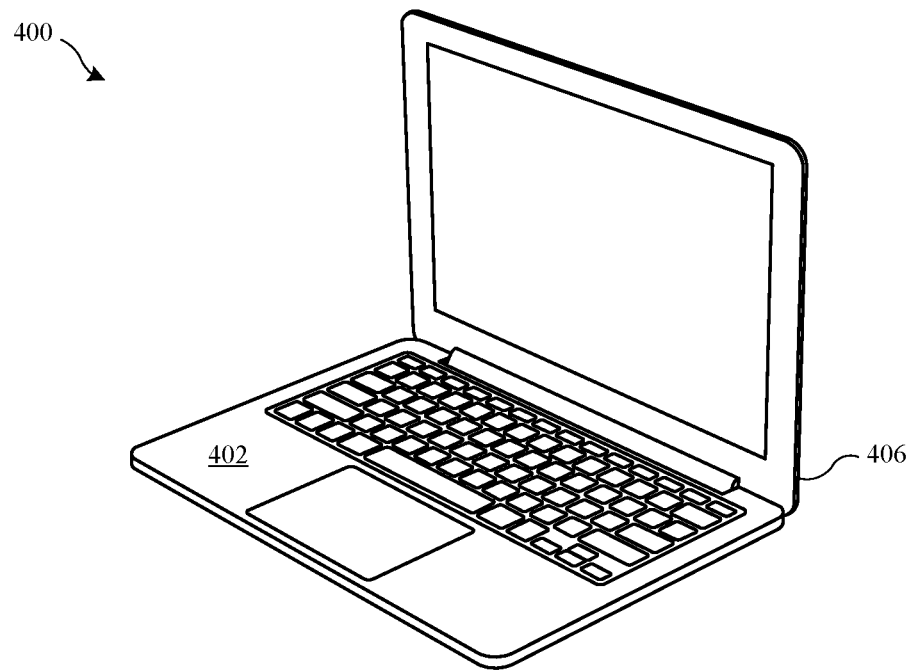
FIGS. 4A-4B show top and bottom perspective view of a portable computing device suitable for use with the described embodiments.
Figure 4B:
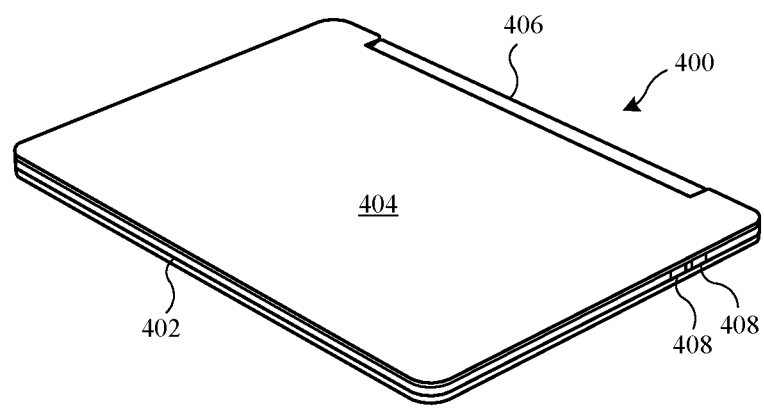

FIG. 4A depicts a perspective view of portable computing device 400 suitable for use with the described embodiments. Portable computing device 400 can include top case 402 and bottom case 404, which cooperate to form an internal volume. In some embodiments, top case 402 and bottom case 404 can be attached to each other. Attachment of top case 402 to bottom case 404 can be accomplished by any number of attachment features including by threaded fasteners, adhesive, snap attachments, or some combination of attachment the aforementioned attachment features. Circuitry for supporting I/O port functionality can be disposed within the internal volume. In some embodiments, portable computing device 400 can be a laptop that includes hinged display assembly 406. FIG. 4B depicts another perspective view of portable computing device 400 and shows how top case 402 can include user accessible ports 408 for transferring data and/or power into and out of portable computing device 400. In some embodiments, user accessible ports 408 can include any number of the following types of ports: power, USB 2.0, USB 3.0, audio, DisplayPort, High Definition Media Input, and camera media cards.

Figure 4C:
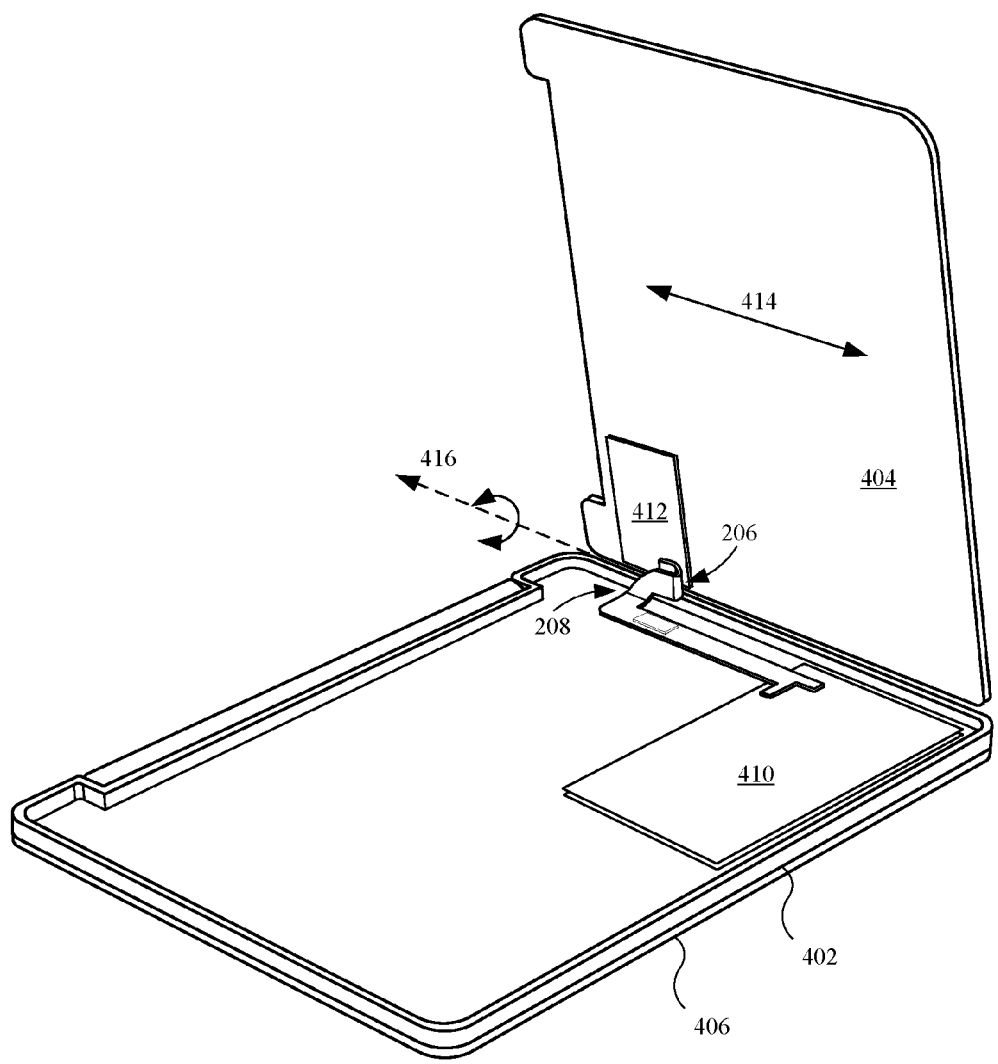
FIG. 4C shows an illustrative view by which various bends in the flex can facilitate assembly of the portable computing device.

FIG. 4C shows how flexible circuit assembly 100 can be utilized to electrically couple two electrical components within portable computing device 400: main logic board 410 and I/O board 412. As depicted, bend region 206 of flexible circuit assembly 100 allows for translation of bottom case 404 with respect to top case 402 along axis 414 and bend region 208 of flexible circuit assembly 100 allows for rotation of bottom case 404 with respect to top case 402 about axis of rotation 416.

Figure 5:
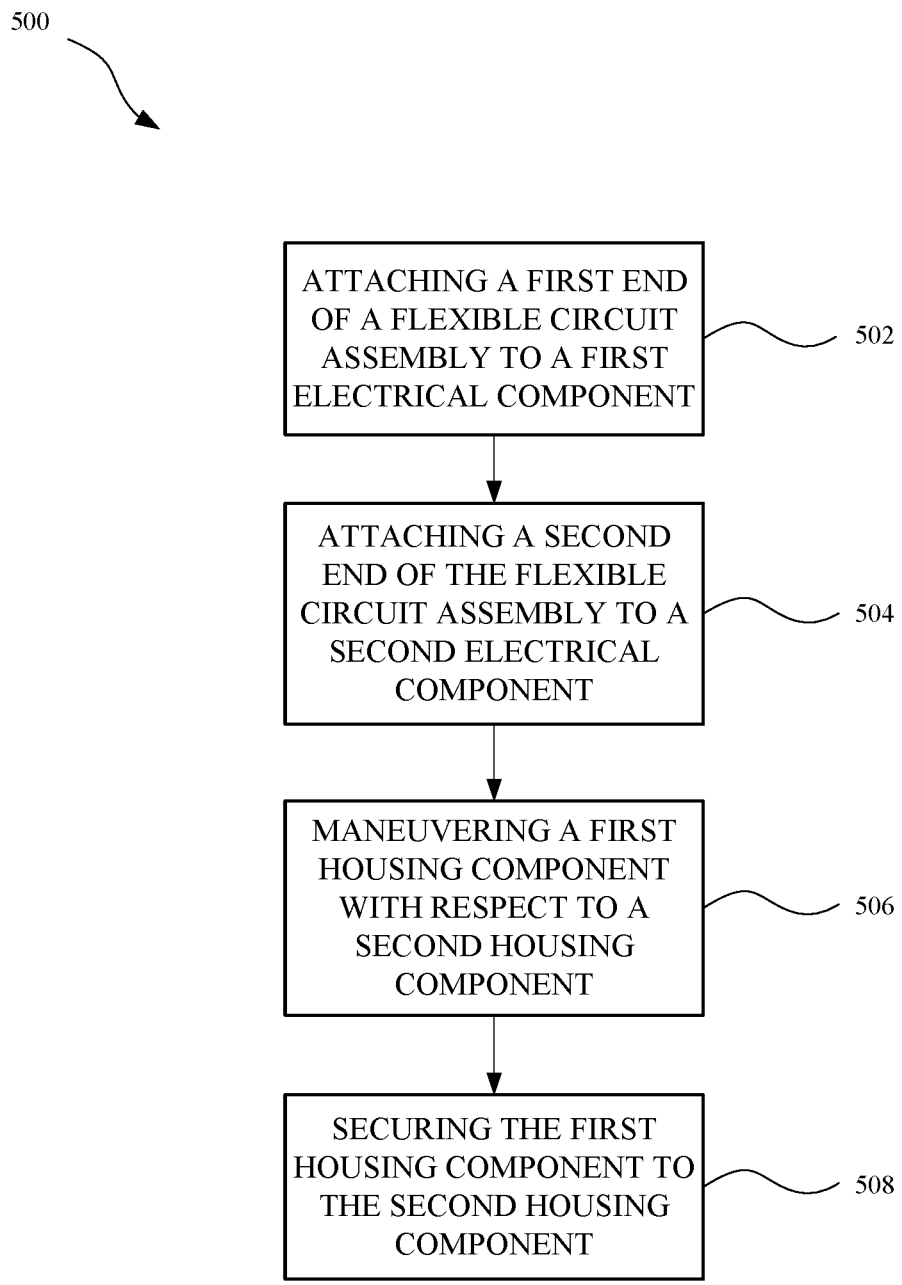
FIG. 5 shows a flow chart illustrating a method for assembling a portable computing device with a flexible circuit assembly.

FIG. 5 shows a flow chart depicting a method 500 for assembling a portable computing device containing a flexible circuit assembly. At step 502 a first end of the flexible circuit assembly is coupled with a first electrical component, which is disposed within a first housing component. The coupling can be accomplished by a board-to-board connector or in some embodiments the flexible circuit assembly can be soldered to the first component. At step 504, a second end of the flexible circuit assembly is coupled with a second component, which is disposed within a second housing component. At step 506, the second housing component is shifted with respect to the first housing component, the relative movement between the components being accommodated by excess flexible circuit material contained within the flexible circuit assembly. At step 508 the first and second housing components are secured together.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A flexible circuit assembly, comprising:
   a flexible substrate comprising a power layer and a data layer, the data layer and the power layer defining a first bend and a second bend oriented in a different direction than the first bend;
   a first connector at a first end of the flexible substrate, the first connector configured to connect to a first component;
   a second connector at a second end of the flexible substrate, the first connector configured to connect to a second component, wherein the first bend and the second bend cooperate to accommodate relative motion, in at least two dimensions, between the first component and the second component; and
   a booster assembly integrated with the flexible substrate, the booster assembly capable of amplifying signals passing through the data layer, the booster assembly electrically coupled with the power layer and the data layer, wherein the booster assembly comprises:
   a first data layer configured to carry data signals in accordance with a first bandwidth;
   a second data layer configured to carry data signals in accordance with a second bandwidth different from the first bandwidth; and
   a grounding layer positioned between the first data layer and the second data layer.

2. The flexible circuit assembly as recited in claim 1, wherein the booster assembly comprises a signal boosting component that is shielded by an electromagnetic interference (EMI) shield that is surface mounted to the flexible substrate.

3. The flexible circuit assembly as recited in claim 2, wherein a metal stiffener is mounted to the flexible substrate opposite the EMI shield.

4. The flexible circuit assembly as recited in claim 1, wherein the flexible substrate is split at a location corresponding to at least one of the first bend and the second bend such that the data layer and the power layer are separated by an air gap.

5. The flexible circuit assembly as recited in claim 1, wherein the data layer and the power layer further define a third bend, wherein the first bend and the third bend combine to position the first connector over a portion of the flexible substrate.

6. The flexible circuit assembly as recited in claim 1, further comprising: a first shield layer and a second shield layer that combines with the first shield layer to surround the first data layer, the second data layer, and the grounding layer; and an electromagnetic interference (EMI) shield that combines with first shield layer to surround and protect a signal boosting component of the booster assembly; and an electrically conductive gasket that provides an electrical grounding pathway for the EMI shield.

7. An electronic device, comprising:
   a device housing that defines an internal volume that carries electrical components;
   a port arranged along an exterior surface of the device housing, the port configured to receive data signals and system power; and
   a flexible circuit assembly disposed in the internal volume, the flexible circuit assembly configured to route the data signals and the system power received at the data port to the electrical components, the flexible circuit assembly comprising:
a flexible substrate having a first shield layer, and
a booster assembly comprising a signal boosting component that is surface mounted to the flexible substrate, the booster assembly amplifying signal strength of the data signals travelling through the flexible substrate, the booster assembly comprising:
a signal boosting component configured to amplify the signal strength of the data signals,
an electromagnetic interference (EMI) shield that combines with the first shield layer to surround and protect the signal boosting component, and
an electrically conductive gasket that provides an electrical grounding pathway between the EMI shield and the device housing.

8. The electronic device as recited in claim 7, wherein the flexible substrate comprises a data layer and a power layer.

9. The electronic device as recited in claim 8, wherein the flexible substrate further comprises a a second shield layer that combines with the first shield layer to shield the data layer and the power layer from electromagnetic interference (EMI) and provide a grounding pathway for the signal boosting component.

10. The electronic device as recited in claim 7, wherein the power and data layers of one portion of the flexible substrate are separated at a bend region of the flexible substrate.

11. A flexible circuit assembly, comprising:
a flexible substrate comprising a data layer and a power layer;
an electrical assembly that is surface mounted to an exterior surface of the flexible substrate and in electrical contact with the data layer and the power layer, the electrical assembly including a signal boosting component covered by an electromagnetic interference (EMI) shield, the signal boosting component configured to amplify signals routed through the data layer;
electrical connectors connected to opposite ends of the flexible substrate, the electrical connectors capable of electrically connecting to electrical components and pass the signals that are amplified by the signal boosting component; and
an electrically conductive gasket secured to an exterior surface of the EMI shield and providing a grounding path for electricity within the EMI shield to travel from the EMI shield to an electrical ground.

12. The flexible circuit assembly as recited in claim 11, wherein the EMI shield is surface mounted to and electrically grounded through the flexible substrate.

13. The flexible circuit assembly as recited in claim 11, further comprising a multiplexing component that separates at least one of the signals routed through the data layer into multiple signals.

14. The flexible circuit assembly as recited in claim 13, wherein each signal that is separated corresponds to a different type of standard data port.

15. The flexible circuit assembly as recited in claim 11, wherein the electrical assembly is powered by power supplied through the power layer.

16. The flexible circuit assembly as recited in claim 11, wherein the data layer is a high speed data layer that processes signals in accordance with a first bandwidth, and wherein the flexible substrate further comprises:
a grounding layer positioned between the power layer and the high speed data layer;
a low speed data layer positioned between the power layer and the high speed data layer, the low speed data layer configured to process the signals in accordance with a second bandwidth that is different from the first bandwidth.

17. The flexible circuit assembly as recited in claim 11, wherein the flexible substrate includes at least two overlapping bend regions that accommodate relative motion of components electrically connected by the substrate.

18. The flexible circuit assembly as recited in claim 11, wherein the electrical connectors include a first connector configured connect to first component and a second connector configured to connect to a second component, and wherein the flexible substrate defines a first bend and a second bend that cooperates with the first bend to accommodate relative motion, in at least two dimensions, between the first component and the second component.

* * * * *